United States Patent
Lee et al.

(10) Patent No.: US 10,332,909 B2
(45) Date of Patent: Jun. 25, 2019

(54) ETCHANT COMPOSITION, METHOD OF MANUFACTURING SEMICONDUCTOR DEVICE USING THE SAME, AND SEMICONDUCTOR DEVICE

(71) Applicant: SK hynix Inc., Icheon-si Gyeonggi-do (KR)

(72) Inventors: Seung Cheol Lee, Icheon-si Gyeonggi-do (KR); Woo Jae Chung, Yongin-si Gyeonggi-do (KR); Choung Sik Song, Gongju-si Chungcheongnam-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/986,193

(22) Filed: May 22, 2018

(65) Prior Publication Data
US 2019/0115360 A1   Apr. 18, 2019

(30) Foreign Application Priority Data

Oct. 13, 2017   (KR) .......................... 10-2017-0133249

(51) Int. Cl.
| | |
|---|---|
| *H01L 27/11582* | (2017.01) |
| *C09K 13/06* | (2006.01) |
| *H01L 21/768* | (2006.01) |
| *H01L 27/1157* | (2017.01) |
| *H01L 21/311* | (2006.01) |

(52) U.S. Cl.
CPC ........ *H01L 27/11582* (2013.01); *C09K 13/06* (2013.01); *H01L 21/31111* (2013.01); *H01L 21/76877* (2013.01); *H01L 27/1157* (2013.01)

(58) Field of Classification Search
CPC ......... H01L 27/11582; H01L 21/31111; H01L 27/1157; H01L 21/76877; C09K 13/06
See application file for complete search history.

(56) References Cited

FOREIGN PATENT DOCUMENTS

| KR | 1020140122057 A | 10/2014 |
|---|---|---|
| KR | 1020150080769 A | 7/2015 |
| KR | 1020160111650 A | 9/2016 |
| KR | 1020180020806 A | 2/2018 |

*Primary Examiner* — Anthony Ho
(74) *Attorney, Agent, or Firm* — William Park & Associates Ltd.

(57) ABSTRACT

Provided herein is a semiconductor device and a method of manufacturing the same. The method includes alternately forming sacrificial layers and interlayer insulating layers on a semiconductor substrate. The method further includes forming a slit to expose the sacrificial layers by etching through the sacrificial layers and the interlayer insulating layers and forming interlayer openings by removing the exposed sacrificial layers. The method also includes depositing a conductive material in the interlayer openings and forming seams in which core patterns are deposited. The method additionally includes oxidizing a portion of the conductive material in the interlayer openings using a wet etching process and forming conductive patterns by removing the oxidized portion of the conductive material from the interlayer openings while leaving the seams intact.

18 Claims, 6 Drawing Sheets

ETCHANT COMPOSITION, METHOD OF MANUFACTURING SEMICONDUCTOR DEVICE USING THE SAME, AND SEMICONDUCTOR DEVICE

CROSS-REFERENCE TO RELATED APPLICATION

The present application claims priority under 35 U.S.C. § 119(a) to Korean patent application number 10-2017-0133249 filed on Oct. 13, 2017, in the Korean Intellectual Property Office, the entire disclosure of which is incorporated herein by reference.

BACKGROUND

1. Technical Field

Various embodiments of the present disclosure relate to an etchant composition, a method of manufacturing a semiconductor device using the same, and the semiconductor device.

2. Related Art

With development of the industry related to memory devices, such as nonvolatile memory devices, a demand for highly integrated memory devices is increasing. One means by which improved integration is realized is transitioning from two-dimensional arrangements of memory cells to three-dimensional arrangements of memory cells. However, some manufacturing techniques for memory devices do not carry over from two to three dimensions.

SUMMARY

An embodiment of the present disclosure provides for a semiconductor device including a first plurality of interlayer insulating layers. The semiconductor device also includes a first plurality of conductive patterns alternately arranged with the first plurality of interlayer insulating layers, wherein each conductive pattern of the first plurality of conductive patterns is disposed between adjacent interlayer insulating layers of the first plurality of interlayer insulating layers, and wherein each conductive pattern of the first plurality of conductive patterns includes a seam. The semiconductor device also includes a first plurality of core patterns, wherein each core pattern of the first plurality of core patterns is disposed within a seam of the first plurality of seams, and wherein each core pattern of the first plurality of core patterns protrudes from an etched surface of each conductive pattern of the first plurality of conductive patterns.

Another embodiment of the present disclosure provides for a method of manufacturing a semiconductor device. The method includes alternately forming sacrificial layers and interlayer insulating layers on a semiconductor substrate, wherein the interlayer insulating layers are interleaved with the sacrificial layers. The method also includes forming a slit to expose the sacrificial layers by etching through the sacrificial layers and the interlayer insulating layers and forming interlayer openings by removing the exposed sacrificial layers. The method additionally includes depositing a conductive material in the interlayer openings, wherein a first portion of the conductive material is deposited in the slit, oxidizing a second portion of the conductive material in the interlayer openings and in the slit using a wet etching process. The method further includes forming conductive patterns by removing the oxidized second portion of the conductive material from the interlayer openings and the slit.

A further embodiment of the present disclosure provides for a method of manufacturing a semiconductor device, which includes forming an interlayer opening interposed between a pair of adjacent interlayer insulating layers stacked on a semiconductor substrate and forming a conductive layer between the pair of adjacent interlayer insulating layers by depositing a conductive material in the interlayer opening. The method also includes oxidizing a portion of the conductive layer using a wet etching process and removing the oxidized portion of the conductive layer.

An additional embodiment of the present disclosure provides for an etchant composition including 35 to 85 parts by weight of phosphoric acid, 0.01 to 5 parts by weight of an oxidizer, 0.01 to 10 parts by weight of a corrosion inhibitor, and 5 to 50 parts by weight of a solvent.

DETAILED DESCRIPTION

Various embodiments of the present disclosure are directed to an etchant composition capable of reducing defects of conductive patterns, a method of manufacturing a semiconductor device using the same, and the semiconductor device.

Consistent with the present teachings is a semiconductor device including a first plurality of interlayer insulating layers. The semiconductor device also includes a first plurality of conductive patterns alternately arranged with the first plurality of interlayer insulating layers, wherein each conductive pattern of the first plurality of conductive patterns is disposed between adjacent interlayer insulating layers of the first plurality of interlayer insulating layers, and wherein each conductive pattern of the first plurality of conductive patterns includes a seam. The semiconductor device also includes a first plurality of core patterns, wherein each core pattern of the first plurality of core patterns is disposed within a seam of the first plurality of seams, and wherein each core pattern of the first plurality of core patterns protrudes from an etched surface of each conductive pattern of the first plurality of conductive patterns.

In one embodiment, the semiconductor device further includes at least one cell pillar, wherein the at least one cell pillar passes through the first plurality of interlayer insulating layers and the first plurality of conductive patterns. In a further embodiment, the semiconductor device also includes a barrier layer disposed at interfaces between conductive patterns of the first plurality of conductive patterns and interlayer insulating layers of the first plurality of interlayer insulating layers and at interfaces between conductive patterns of the first plurality of conductive patterns and the at least one cell pillar.

In another embodiment, the semiconductor device includes a slit separating the first plurality of conductive patterns alternately arranged with the first plurality of interlayer insulating layers from a second plurality of conductive patterns alternately arranged with a second plurality of interlayer insulating layers. In one case, the etched surface of each conductive pattern of the first plurality of conductive patterns faces the slit. In another case, the first plurality of conductive patterns includes source-side conductive patterns and the second plurality of conductive patterns includes drain-side conductive patterns.

For one embodiment, each core pattern of the first plurality of core patterns of the semiconductor device includes an oxide layer. For another embodiment, each core pattern of the first plurality of core patterns of the semiconductor device includes a silicon oxide layer.

Also consistent with the present teachings is a method of manufacturing a semiconductor device. The method includes alternately forming sacrificial layers and interlayer insulating layers on a semiconductor substrate, wherein the interlayer insulating layers are interleaved with the sacrificial layers. The method also includes forming a slit to expose the sacrificial layers by etching through the sacrificial layers and the interlayer insulating layers and forming interlayer openings by removing the exposed sacrificial layers. The method additionally includes depositing a conductive material in the interlayer openings, wherein a first portion of the conductive material is deposited in the slit, oxidizing a second portion of the conductive material in the interlayer openings and in the slit using a wet etching process. The method further includes forming conductive patterns by removing the oxidized second portion of the conductive material from the interlayer openings and the slit.

In one embodiment, depositing the conductive material in the interlayer openings includes forming a seam in the conductive material deposited in each of the interlayer openings. In a further embodiment, the method includes depositing a core pattern in each seam. For example, the core pattern is deposited in each seam while depositing the conductive material in the interlayer openings. In one case, the core pattern includes an oxide layer. In another case, the core pattern includes a silicon oxide layer.

For an embodiment of the method, the wet etching process has a greater etch selectivity toward the conductive material than toward a material of the core pattern. For example, the wet etching process of the method oxidizes and dissolves the second portion of the conductive material from the interlayer openings and the slit, and the wet etching process leaves the core pattern of each seam intact. With an embodiment, the wet etching process results in the core pattern of each seam protruding from within a conductive pattern of the conductive patterns, beyond an etched face of the conductive pattern, into the slit.

For an embodiment, an etchant used for the wet etching process includes phosphoric acid, an oxidizer, a corrosion inhibitor, and a solvent. In another embodiment, the method also includes forming a barrier layer on surfaces of the interlayer openings and the slit prior to depositing the conductive material.

Further consistent with the present teachings is method of manufacturing a semiconductor device, which includes forming an interlayer opening interposed between a pair of adjacent interlayer insulating layers stacked on a semiconductor substrate and forming a conductive layer between the pair of adjacent interlayer insulating layers by depositing a conductive material in the interlayer opening. The method also includes oxidizing a portion of the conductive layer using a wet etching process and removing the oxidized portion of the conductive layer.

In one embodiment, forming the conductive layer includes forming a core pattern in the conductive layer. In a further embodiment, forming the core pattern includes depositing an oxide layer in a seam formed in the conductive layer. In one case, the deposited oxide layer is a silicon oxide layer.

In an embodiment of the method, the wet etching process removes the oxidized portion of the conductive layer and leaves the core pattern intact. For one case, the wet etching process results in the core pattern protruding from within the conductive layer beyond an etched face of the conductive layer. In another case, an etchant used for the wet etching process includes phosphoric acid, an oxidizer, a corrosion inhibitor, and a solvent.

The word "depositing," in addition to its meaning in the art, also refers to "filling" or placing a material in a receptacle for some embodiments, such as filling a core pattern in a seam or filling a conductive material in an interlayer opening. The word "filling," as used herein, can, but does not necessarily, imply filling to capacity. For example, a space can be filled from 50% to 100% of a capacity of the space. A conductive material, as used herein, refers to an electrically conductive material.

Example embodiments are described in detail below with reference to the accompanying drawings. Presented embodiments are provided to enable those skilled in the art to practice the present teachings. Those skilled in the art will realize that embodiments in addition to those presented also consistent with the present teachings as described below and set forth in the claims. Therefore, presented embodiments should be interpreted as being descriptive and should not be interpreted as being limiting.

In the drawing figures, relative dimensions may be exaggerated for clarity of illustration and description. It will be understood that when an element is referred to as being "between" two elements, the element can be the only element between the two elements, or there may be one or more additional elements between the two elements.

Some embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as being limited to the particular shapes of regions illustrated herein but may include deviations in shapes that result, for example, from manufacturing. In the drawings, lengths and sizes of layers and regions may be exaggerated for clarity of description. Like reference numerals in the drawings denote like elements.

Terms such as "first" and "second" may be used to distinguish similar components, but they should not limit the various components. The terms are only used for the purpose of differentiating one component from one or more other components. For example, a first component may be referred to as a second component, and a second component may be referred to as a first component without departing from the spirit and scope of the present disclosure. Furthermore, "and/or" may include any one of or a combination of indicated components.

A singular form of a word or phrase may include the plural from unless specifically stated otherwise. Furthermore, "include/comprise" or "including/comprising" as used in the specification represents an open set to which one or more additional components or operations can be added.

Unless defined otherwise, all the terms used in this specification, including technical and scientific terms, have the meaning that would be generally understood by those skilled in the related art. Terms defined by dictionaries should be construed as having the same meanings as would be construed in the context of the related art, and unless clearly defined otherwise in this specification, should not be construed as having idealistic or overly formal meanings.

It is also noted that in this specification, the words "connected" and "coupled" refer not only to one component being directly connected or coupling another component but also to cases for which one or more intermediate components are disposed between the components indicated as being connected or coupled. On the other hand, "directly connected" and "directly coupled" refer to components being directly connected or coupled to one another without any intermediate components.

Figure 1A:
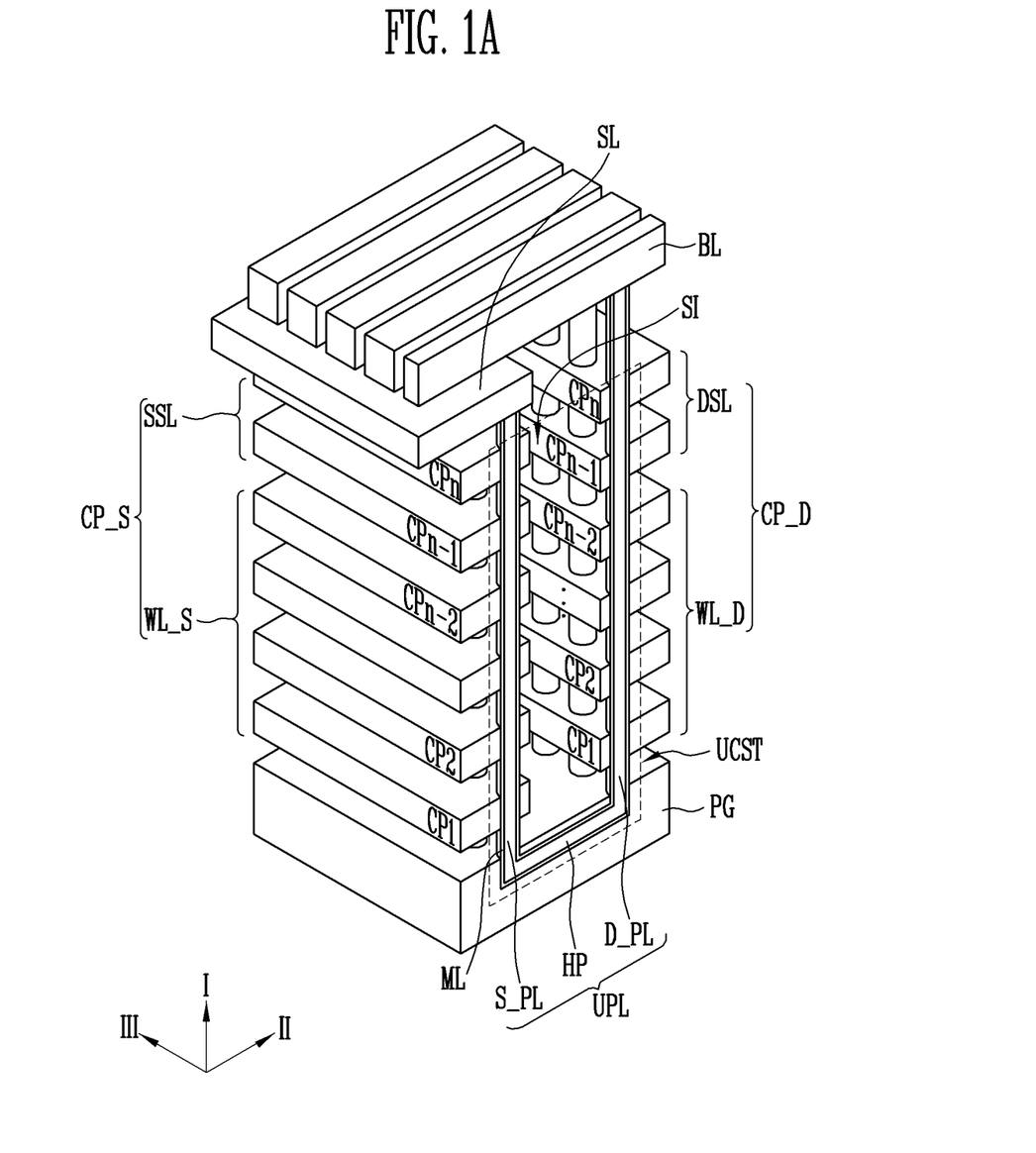
FIGS. 1A and 1B show sectional views illustrating examples of a semiconductor device in accordance with an embodiment of the present disclosure.
Figure 1B:
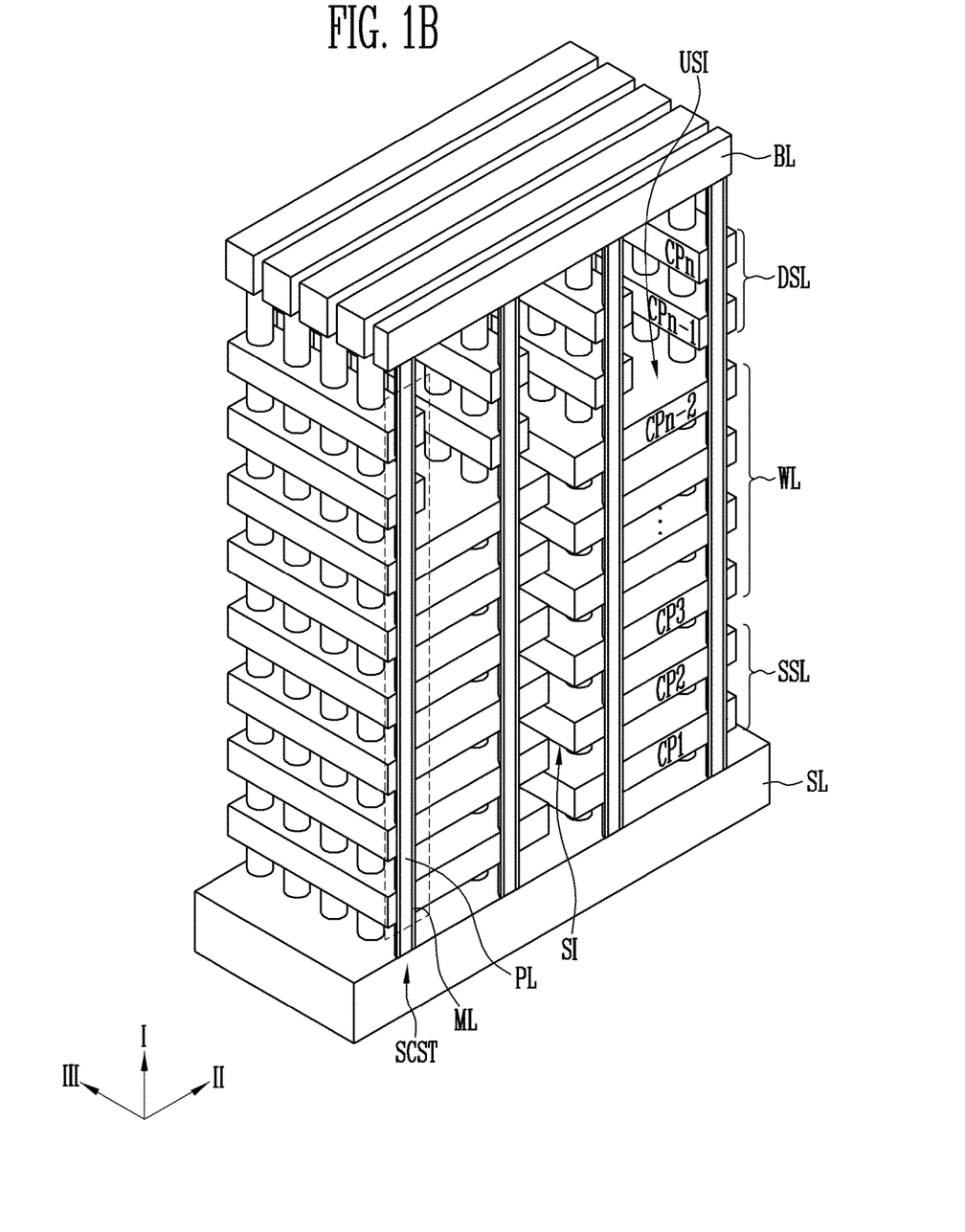

FIGS. 1A and 1B show sectional views illustrating semiconductor devices in accordance with embodiments of the present disclosure. For the sake of recognition of conductive patterns, interlayer insulating layers are not shown in FIGS. 1A and 1B.

Referring to FIGS. 1A and 1B, semiconductor devices may include a three-dimensional memory string UCST or SCST. The three-dimensional memory strings UCST and SCST may enhance the degree of integration for semiconductor devices. For example, the three-dimensional memory string UCST may be formed in a U shape, as shown in FIG. 1A, and the three-dimensional memory string SCST may be formed in a straight shape, as shown in FIG. 1B.

Referring to FIG. 1A, the U-type memory string UCST may include memory cells and select transistors which are arranged along a U-type cell pillar UPL. The memory cells and the select transistors may be coupled to source-side conductive patterns CP_S and drain-side conductive patterns CP_D. The source-side conductive patterns CP_S may be spaced apart from the drain-side conductive patterns CP_D by a slit SI.

The cell pillar UPL may include a source-side pillar S_PL and a drain-side pillar D_PL coupled together by a horizontal part HP. The horizontal part HP is shown embedded in a pipe gate PG. The source-side pillar S_PL and the drain-side pillar D_PL are shown extending from opposite ends of the horizontal part HP in a first direction I. The cell pillar UPL may be formed of a channel layer having the same shape as that of the cell pillar UPL. In addition, the cell pillar UPL may include a core insulating layer with which a central region of a U-type hole is filled, and a channel layer enclosing the core insulating layer. A multilayer layer ML may be further formed on an outer surface of the cell pillar UPL. The multilayer layer ML may extend along the outer surface of the cell pillar UPL.

The cell pillar UPL may be electrically coupled between a source line SL and a bit line BL. For example, the source line SL and the bit line BL are electrically coupled to the channel layer of the cell pillar UPL. The bit line BL and the source line SL are disposed on different layers spaced apart from each other. For example, the source line SL may be disposed below the bit line BL, as shown. The source line SL may be electrically coupled to an upper end of the source-side pillar S_PL. A source contact plug (not shown) may be formed between the source line SL and the source-side pillar S_PL. The bit line BL may be electrically coupled to an upper end of the drain-side pillar D_PL. A drain contact plug (not shown) may be formed between the bit line BL and the drain-side pillar D_PL.

The source-side conductive patterns CP_S may include n conductive patterns (CP1 to CPn: n is a natural number of 2 or more) that are stacked below the source line SL in the first direction I and spaced apart from each other. The drain-side conductive patterns CP_D may include n conductive patterns (CP1 to CPn) that are stacked below the bit line BL in the first direction I and spaced apart from each other.

The source-side conductive patterns CP_S may enclose or surround the source-side pillar S_PL and may be stacked and spaced apart from each other. The source-side conductive patterns CP_S may include source-side word lines WL_S and a source select line SSL. The source select line SSL may be disposed over the source word lines WL_S. In an embodiment, source select lines SSL having a single-layered or a multi-layered structure may be disposed between the source-side word lines WL_S and the source line SL. As illustrated, the source select line SSL is configured to include an n-th conductive pattern CPn, disposed in an uppermost layer of the source-side conductive patterns CP_S, and an n−1-th conductive pattern CPn−1, disposed just below the n-th conductive pattern CPn. In other embodiments, the source select line SSL may be configured differently.

The drain-side conductive patterns CP_D may enclose or surround the drain-side pillar D_PL and may be stacked and spaced apart from each other. The drain-side conductive patterns CP_D may include drain-side word lines WL_D and a drain select line DSL. The drain select line DSL may be disposed over the drain-side word lines WL_D. The drain select line DSL may have a single-layered or a multi-layered structure between the drain-side word lines WL_D and the bit line BL. As illustrated, the drain select line DSL is configured to include an n-th conductive pattern CPn, disposed in an uppermost layer of the drain-side conductive patterns CP_D, and an n−1-th conductive pattern CPn−1, disposed just below the n-th conductive pattern CPn. In other embodiments, the drain select line DSL may be configured differently.

Each of the source-side conductive patterns CP_S and the drain-side conductive patterns CP_D may include a core pattern. Each core pattern may have a structure suitable for filling a seam provided in a corresponding one of the source-side conductive patterns CP_S and the drain-side conductive patterns CP_D. The core pattern may be an oxide layer or a silicon-oxide layer. The source-side conductive patterns CP_S and the drain-side conductive patterns CP_D are described in greater detail below with reference to FIG. 2.

The slit SI may be formed between the source-side conductive patterns CP_S and the drain-side conductive patterns CP_D, which are shown adjacent to each other in a second direction II and which may extend in a third direction III. As shown, the second direction II and the third direction III define a plane intersected by the first direction I. For example, the first I, second II, and third III directions define a Cartesian coordinate system. With respect to the indicated directions, the source-side conductive patterns CP_S, the drain-side conductive patterns CP_D, and the source line SL may extend in the third direction III, and the bit line BL may extend in the second direction II.

The pipe gate PG may be disposed below both the source-side conductive patterns CP_S and the drain-side conductive patterns CP_D and may be formed to enclose the horizontal part HP of the cell pillar UPL. Specifically the pipe gate PG may be disposed below the conductive patterns CP1 to CPn on the source side and on the drain side.

Source-side memory cells are formed at intersections between the source-side pillar S_PL and the source-side word lines WL_S. Drain-side memory cells are formed at intersections between the drain-side pillar D_PL and the drain-side word lines WL_D. A source select transistor is formed at an intersection between the source-side pillar S_PL and the source select line SSL. A drain select transistor is formed at an intersection between the drain-side pillar D_PL and the drain select line DSL. A pipe transistor is formed at an intersection between the horizontal part HP and the pipe gate PG.

The source select transistor, the source-side memory cells, the pipe transistor, the drain-side memory cells, and the drain select transistor are arranged along the U-type cell pillar UPL and may be coupled in series through the channel layer included in the U-type cell pillar UPL. The source select transistor, the source-side memory cells, the pipe transistor, the drain-side memory cells, and the drain select transistor coupled in series define the U-type memory string UCST along the "U" shape of the cell pillar UPL.

The source-side word lines WL_S may transmit signals to gates of the source-side memory cells. The drain-side word lines WL_D may transmit signals to gates of the drain-side memory cells. The source select line SSL may transmit a signal to a gate of the source select transistor. The drain select line DSL may transmit a signal to a gate of the drain select transistor. The pipe gate PG may transmit a signal to a gate of the pipe transistor. The pipe transistor may couple the source-side memory cells and the drain-side memory cells to each other, in response to a signal applied to the pipe gate PG.

Cell pillars may have various shapes apart from the above-described "U" shape. For example, a cell pillar may have a "W" shape. An arrangement of memory cells may vary in shape depending on a structure of a cell pillar associated with the memory cells. Thereby, memory string structures may have various shapes.

Referring to FIG. 1B, a straight memory string SCST may include memory cells and select transistors which are stacked along a straight cell pillar PL. Gates of the memory cells and gates of the select transistors may be coupled to conductive patterns CP1 to Cpn. The conductive patterns CP1 to CPn may be divided into word lines WL, source select lines SSL, and drain select lines DSL by slits SI and USI.

The cell pillar PL may be formed of a channel layer having the same shape as that of the cell pillar PL. In addition, the cell pillar PL may include a core insulating layer with which a central region of a straight hole is filled, and a channel layer enclosing the core insulating layer. An outer surface of the cell pillar PL may be enclosed by a multilayer layer ML. The multilayer layer ML may extend along the outer surface of the cell pillar PL.

An upper end of the cell pillar PL may be electrically coupled to a bit line BL. For example, the channel layer of the cell pillar PL may be electrically coupled to the bit line BL. Additionally, a drain contact plug (not shown) may be formed between the bit line BL and the cell pillar PL.

The cell pillar PL may be electrically coupled to a source layer SL. For example, the channel layer of the cell pillar PL may be electrically coupled to the source layer SL. The source layer SL may have various structures.

The source layer SL may come into contact with the bottom of the cell pillar PL. The source layer SL may be formed of a doped polysilicon layer. The cell pillar PL may come into contact with an upper surface of the source layer SL and extend in the first direction I toward the bit line BL.

The multilayer layer ML may extend along a side surface of the cell pillar PL. A top surface and the bottom surface of the cell pillar PL may be open rather than being closed by the multilayer layer ML. The top surface of the cell pillar PL may be electrically coupled to the bit line BL, and the bottom surface of the cell pillar PL may be electrically coupled to the source layer SL.

The conductive patterns CP1 to CPn may be disposed in n layers spaced apart from each other between the bit line BL and the source line SL. The conductive patterns CP1 to CPn may enclose or surround the cell pillars PL and may be stacked and spaced apart from each other in the first direction I. The conductive patterns CP1 to CPn may include a source select line SSL, word lines WL, and a drain select line DSL. The source select line SSL may be disposed over the source layer SL. The word lines WL may be disposed over the source select line SSL. The drain select line DSL may be disposed over the word lines WL.

Each of the conductive patterns CP1 to CPn may include a core pattern. Each core pattern may have a structure suitable for filling a seam provided in a corresponding one of the conductive patterns CP1 to CPn. The core pattern may be an oxide layer or a silicon-oxide layer. The conductive patterns CP1 to CPn are described in greater detail below with reference to FIG. 2.

The slits SI and USI may include a first slit SI that completely passes through the conductive patterns CP1 to CPn and a second slit USI that passes through one or more uppermost layers of the conductive patterns CP1 to CPn. The first slit SI and the second slit USL may extend in the third direction III.

Among the conductive patterns CP1 to CPn, some conductive patterns (e.g., CP3 to CPn−2) that are successively stacked may be divided into word lines WL by the first slit SI.

One or more layers of conductive patterns disposed between the word lines WL and the source layer SL may be divided into source select lines SSL by the first slit SI. As illustrated, the source select line SSL is formed of a first pattern CP1, that is disposed in a lowermost layer of the conductive patterns CP1 to CPn, and a second pattern CP2, disposed over the first pattern CP1. In different embodiments, the source select line SSL may include one or more conductive patterns.

One or more layers of conductive patterns disposed between the word lines WL and the bit line BL may be divided into drain select lines DSL by the first slit SI and the second slit USI. As illustrated, the drain select line DSL is formed of an n-th pattern CPn, that is disposed in an uppermost layer of the conductive patterns CP1 to CPn, and an n−1-th pattern CPn−1, disposed below the n-th pattern CPn. In different embodiments, the drain select line DSL may include one or more conductive patterns.

The word lines WL, the drain select lines DSL, and the source select lines SSL may extend in the third direction III. The bit line BL may extend in the second direction II.

In an embodiment, the first slits SI and the second slits USI may alternate with each other in the second direction II. Each of the word lines WL may extend beyond the second slit USI rather than being divided into parts by the second slit USI. Each of the word lines WL may enclose or surround a plurality of cell pillars PL in common. The cell pillars PL that are enclosed in common by each of the word lines WL may be divided into bit groups, each of which is enclosed by the corresponding drain select lines DSL. For example, the cell pillars PL enclosed in common by each of the word lines WL may be divided into a first bit group and a second bit group with the second slit USI interposed therebetween. The first bit group and the second bit group may be controlled by different drain select lines DSL.

The memory cells are formed at intersections between the cell pillar PL and the word lines WL, a drain select transistor is formed at an intersection between the cell pillar PL and the drain select line DSL, and a source select transistor is formed at an intersection between the cell pillar PL and the source select line SSL. The source select transistor, the memory cells and the drain select transistor may be arranged in a line along each cell pillar PL, may be coupled in series to each other through the channel layer of the cell pillar PL, and may thus define the straight memory string SCST. The word lines WL may transmit signals to the gates of the memory cells. The source select line SSL may transmit a signal to a gate of the source select transistor. The drain select line DSL may transmit a signal to a gate of the drain select transistor.

Figure 2:
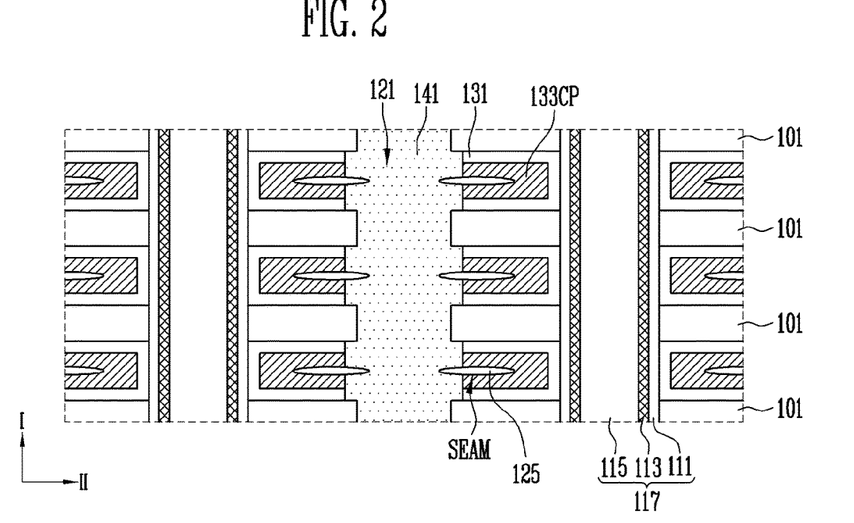
FIG. 2 shows a sectional view illustrating a semiconductor device in accordance with an embodiment of the present disclosure.

FIG. 2 shows a sectional view illustrating a semiconductor device in accordance with an embodiment of the present disclosure.

Referring to FIG. 2, each cell pillar 117 having a vertical structure may be formed of multiple layers. For example, the cell pillar 117 may include a core insulating layer 115 with which a central region of the cell pillar 117 is filled, a channel layer 113 enclosing the core insulating layer 115, and a multilayer layer 111 enclosing the channel layer 113. The multilayer layer 111 may have a structure in which a tunnel insulating layer, a data storage layer, and a blocking insulating layer are successively stacked to enclose the channel layer 113. The multilayer layer 111 may be formed of an ONO (an oxide layer—a nitride layer—an oxide layer) structure.

A plurality of interlayer insulating layers 101, stacked and spaced apart from each other in the first direction I, enclose or surround the cell pillar 117. Conductive patterns 133CP are disposed between the interlayer insulating layers 101. Each of the conductive patterns 133CP may be formed of metal material, e.g., a tungsten layer. Each of the conductive patterns 133CP may include a seam SEAM. The seam SEAM may be filled with a core pattern 125. The core pattern 125 may be an oxide layer or a silicon-oxide layer. The core pattern 125 may protrude from a side surface of the conductive pattern 133CP. More specifically, the core pattern 125 may protrude from a side surface of the conductive pattern 133CP that faces the slit 121.

Barrier layers 131 may be formed at respective interfaces between the interlayer insulating layers 101 and the conductive patterns 133CP. For some embodiments, each barrier layer 131 may be formed of a titanium nitride (TiN) layer.

The interlayer insulating layers 101 and the conductive patterns 133CP disposed between the cell pillars 117 may be physically separated from each other by the slit 121. The slit 121 may be filled with a sealing insulating layer 141.

FIGS. 3A, 3B, 3C, 3D, and 3E show sectional views illustrating a method of manufacturing a semiconductor device in accordance with an embodiment of the present disclosure.

Figure 3A:
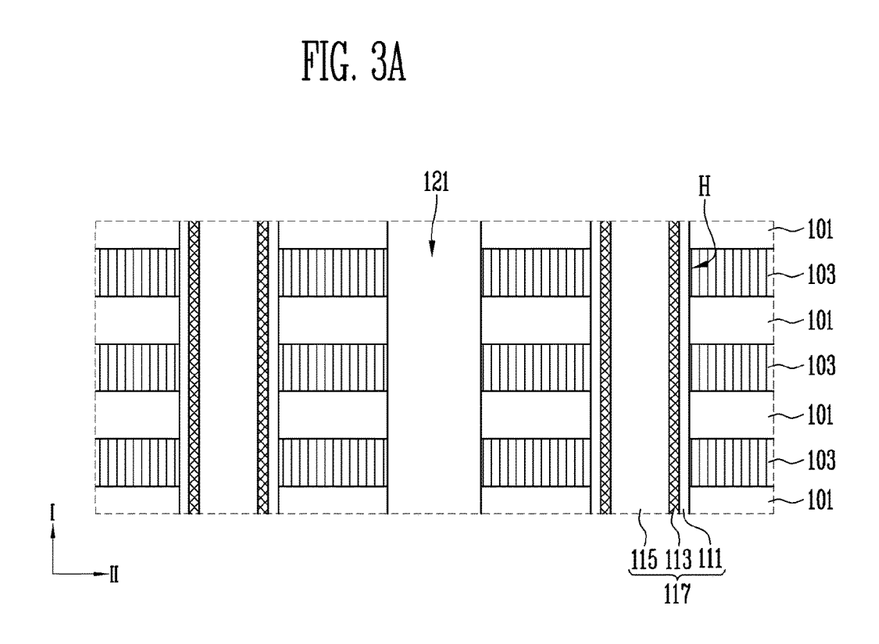
FIGS. 3A to 3E show sectional views illustrating a method of manufacturing a semiconductor device in accordance with an embodiment of the present disclosure.

Referring to FIG. 3A, the interlayer insulating layers 101 and sacrificial layers 103 are alternately stacked on a lower structure (not shown). A total number of stacked layers can vary from embodiment to embodiment. The interlayer insulating layers 101 and the sacrificial layers 103 may be formed of different materials. For example, the sacrificial layers 103 may be made of a material having a different etching rate from an etching rate for a material from which the interlayer insulating layers 101 are made. In some cases, the interlayer insulating layers 101 may be made of oxide layers, and the sacrificial layers 103 may be made of nitride layers having an etching rate different from that of the oxide layers.

The lower structure may include the pipe gate PG shown in FIG. 1A or the source layer SL shown in FIG. 1B.

Thereafter, the interlayer insulating layers 101 and the sacrificial layers 103 are etched so that holes H passing through the layers 101, 103 are formed. Subsequently, the cell pillar 117 is formed in each of the holes H. An operation for forming the cell pillar 117 may include an operation of forming the multilayer layer 111 on the surface of each hole H and an operation of forming the channel layer 113 on the multilayer layer 111. The multilayer layer 111 may be formed by successively stacking the blocking insulating layer, the data storage layer, and the tunnel insulating layer on the surface of each hole H. The channel layer 113 may be formed using a semiconductor. For example, the channel layer 113 may include a silicon layer. The channel layer 113 may be formed so that each hole H is completely filled with the channel layer 113. In another embodiment, channel layer 113 may be formed so that a central opening passes axially through each hole H. In such case, the operation for forming the cell pillar 117 may include the operation of filling the central opening of each hole H with the core insulating layer 115.

Thereafter, the slit 121 passing through the interlayer insulating layers 101 and the sacrificial layers 103 is formed. The slit 121 may correspond to the slit SI shown in FIGS. 1A and 1B. The slit 121 may be formed by etching the interlayer insulating layers 101 and the sacrificial layers 103 between adjacent cell pillars 117.

Figure 3B:
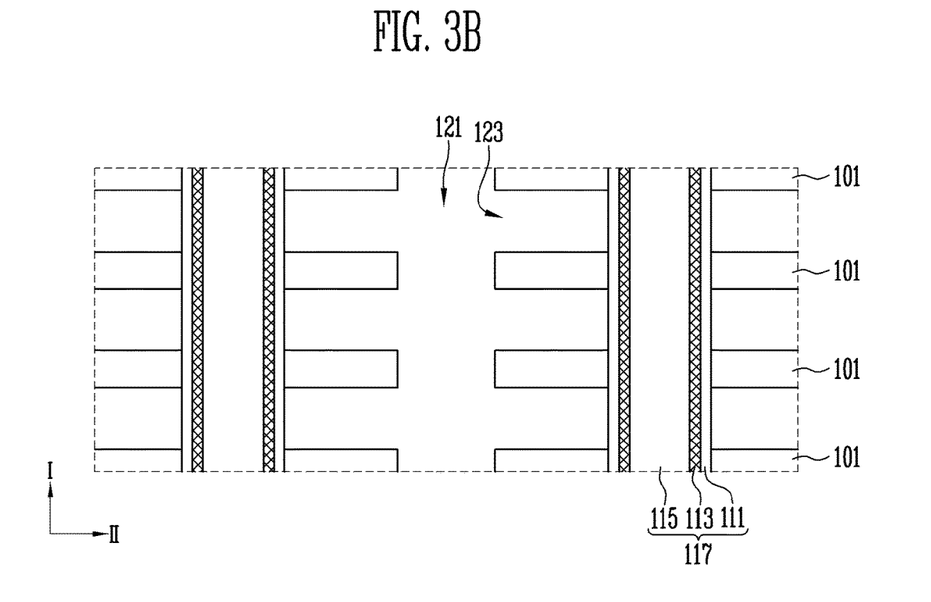

Referring to FIG. 3B, the sacrificial layers 103 shown in FIG. 3A, which are exposed through the slit 121, are removed. The sacrificial layers 103 may be selectively removed by exploiting a difference in etching rate between the sacrificial layers 103 and the interlayer insulating layers 101. When the sacrificial layers 103 are formed of nitride layers, phosphoric acid may be used to selectively remove the sacrificial layers 103. Thereby, interlayer openings 123 are formed between the interlayer insulating layers 101. For some embodiments, a portion of each interlayer insulating layer 101 may also be etched to widen each interlayer opening 123. The interlayer insulating layers 101 remain stacked at positions spaced apart from each other in the first direction I with the cell pillar 117 enclosed or surrounded by the interlayer insulating layers 101.

Figure 3C:
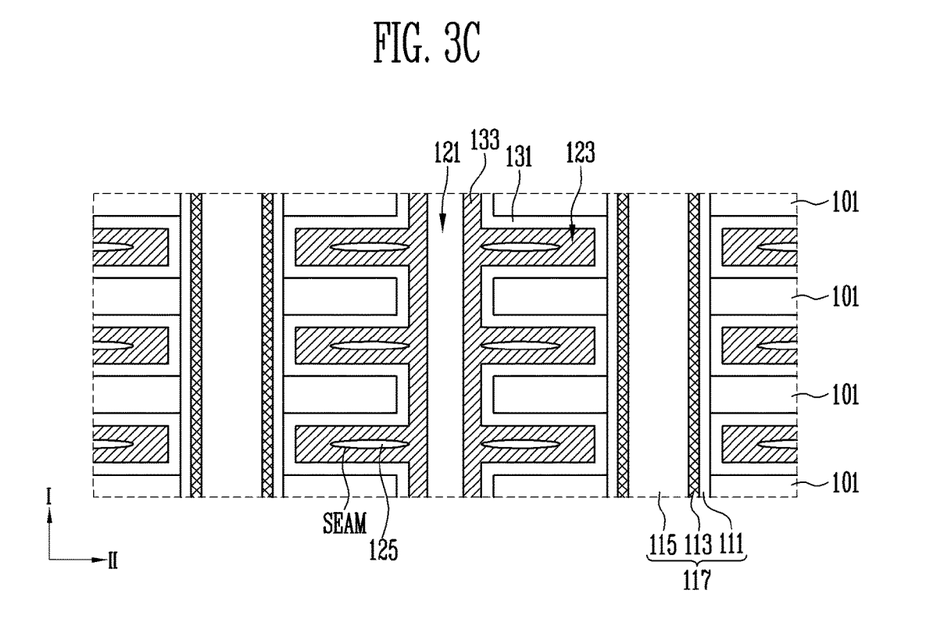

Referring to FIG. 3C, a conductive layer 133 is formed through the slit 121 so that the interlayer openings 123 are filled with the conductive layer 133. The conductive layer 133 may be formed of a metal or a metal material having a low electrical resistance. For example, the conductive layer 133 may be a tungsten layer. A low-resistance metal layer formed of a material, such as tungsten, may be formed using a chemical vapor deposition (CVD) process, an atomic layer deposition (ALD) process, or a similar process for depositing the metal material. In one instance, a tungsten layer may be formed using a tungsten precursor and a reducer. Tungsten hexafluoride $WF_6$ may be used as the tungsten precursor. The conductive layer 133 may extend to an upper portion of the sidewall of the slit 121.

For some embodiments, a barrier layer 131 is formed before the conductive layer 133 is formed. The barrier layer 131 may extend from the surfaces of the interlayer openings 123 to the surface of the slit 121. In some instances, the barrier layer covers the surfaces of the interlayer openings 123 and the surface of the slit 121. The barrier layer 131 may be formed of a titanium nitride (TiN) layer. The barrier layer may be formed of a titanium nitride layer, a tungsten nitride layer, a tantalum nitride layer, etc., so as to prevent the conductive layer 133 from coming into direct contact with the blocking insulating layer 111, thereby blocking metal diffusion.

A seam SEAM may be formed in the conductive layer 133 with which the interlayer openings 123 are filled. The seam SEAM formed in the conductive layer 133 may be filled with the core pattern 125 through a subsequent process. The core pattern 125 may be an oxide layer or a silicon-oxide layer and be formed during a semiconductor manufacturing process after the seam has been formed in the conductive layer 133.

Figure 3D:
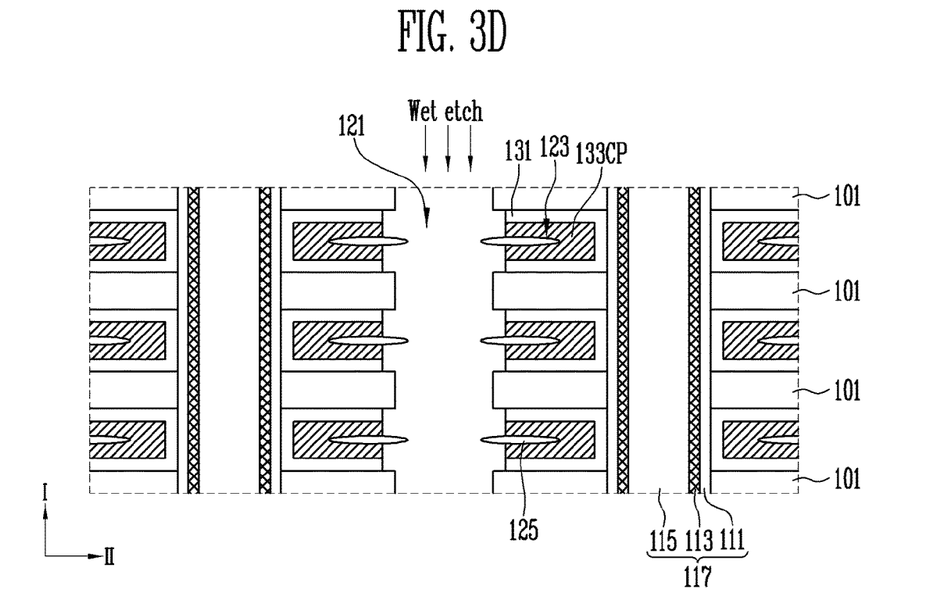

Referring to FIG. 3D, a portion of the conductive layer 133 and a portion of the barrier layer 131 are etched so that the conductive layer 133 described with reference to FIG. 3C is removed from the slit 121. A process of etching the conductive layer 133 and the barrier layer 131 may be performed using a wet etching method.

An etchant composition used during the etching process using the wet etching method is described below.

In various embodiments, the etchant composition may include phosphoric acid, an oxidizer, a corrosion inhibitor, and a solvent. For some embodiments, the etchant composition may include, based on 100 parts by weight of the etchant composition: 35 to 85 parts by weight of the phosphoric acid; 0.01 to 5 parts by weight of the oxidizer; 0.01 to 10 parts by weight of the corrosion inhibitor; and 5 to 50 parts by weight of the solvent.

The oxidizer included in the etchant composition produces metal oxide by oxidizing the barrier layer 131 and the conductive layer 133. The oxidizer may be a compound including at least one component selected from a group consisting of hydrogen peroxide, hydrochloric acid, nitric acid, bromic acid, iodic acid, perchloric acid, sulfuric acid, hydrofluoric acid, perbromic acid, periodic acid, methanesulfonic acid, para-toluene sulfonic acid, benzenesulfonic acid, ammonium persulfate, ammonium nitrate, and hydrogen peroxide-urea.

The corrosion inhibitor not only functions as an auxiliary oxidizer, but it also prevents the core pattern 125 in the conductive layer 133 from being corroded. The corrosion inhibitor may include at least one component selected from a group consisting of ammonium sulfate, ammonium phosphate monobasic, ammonium phosphate dibasic, ammonium phosphate tribasic, ammonium chloride, ammonium acetate, ammonium carbonate, ammonium iodide, 1,2,4-triazole, 3-aminotriazole, 5-aminotetrazole, benzotriazole, pyrazole, imidazole, ascorbic acid, citric acid, succinic acid, maleic acid, malonic acid, thioglycolic acid, tanic acid, methyl gallate, ethyl gallate, and propyl gallate.

The etchant composition may have an etch selectivity of from 1:1 to 1:2 relative to the conductive layer 133 and the barrier layer 131.

In an embodiment, the etching process using the wet etching method may be performed at a process temperature ranging from 50 degrees Celsius (° C.) to 150° C.

In a case where the conductive layer 133 is formed of tungsten (W) and the barrier layer 131 is formed of a titanium nitride (TiN), portions of the conductive layer 133 and the barrier layer 131 are oxidized by the oxidizer, generating metal oxide layers ($WO_3$ and $TiO_2$). The generated metal oxide layers ($WO_3$ and $TiN_2$) are dissolved by $H_3O^+$ ions generated by a phosphoric acid aqueous solution.

The dissolution of the metal oxide layers ($WO_3$ and $TiO_2$) is represented by the following chemical formulas:

$$TiO_2 + 4H_3O^+ \rightarrow Ti^{4+} + 6H_2O$$

$$WO_3 + 6H_3O^+ \rightarrow W^{6+} + 9H_2O$$

As a result of the wet etching process using the etchant, the surfaces of the conductive layer 133 and the barrier layer 131 are oxidized by the oxidizer of the etchant, and the oxidized portions of the conductive layer 133 and the barrier layer 131 are dissolved and removed by the phosphoric acid.

During the etching process, the core pattern 125 may be exposed as a result of etching the conductive layer 133. Due to the corrosion inhibitor, the exposed core pattern 125 is prevented from being oxidized. Consequently, during the etching process using the etchant, which includes phosphoric acid, a difference in etch selectivity between the conductive layer 133 and the core pattern 125 is realized. Thus, the core pattern 125 is inhibited or prevented from being etched. Consequently, an etch loss which might otherwise occur along the seam in the conductive layer 133 is inhibited or prevented.

As a result of the etching process, a portion of the conductive layer 133 remains in the interlayer openings 123 as conductive patterns 133CP separated from each other by the interlayer insulating layers 101. For some embodiments, the conductive patterns 133CP correspond to the conductive patterns CP1 to CPn described with reference to FIG. 1A or 1B. Each core pattern 125 may protrude from a side surface of a corresponding conductive pattern 133CP. For example, each core pattern 125 may protrude from an etched side surface of the corresponding conductive pattern 133CP, wherein the etched side surface faces the slit 121.

Figure 3E:
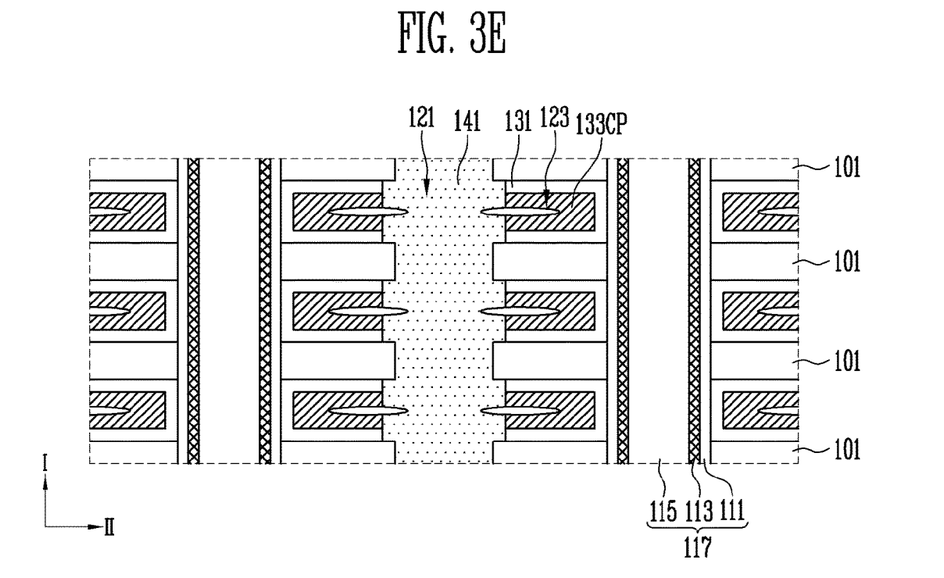

Referring to FIG. 3E, the slit 121 is filled with a sealing insulating layer 141. The sealing insulating layer 141 completely covers the sidewall of the slit 121 that opens to the conductive patterns 133CP, so that the conductive patterns 133CP may be sealed in their respective interlayer openings 123.

The sealing insulating layer 141 may be formed to completely fill the interior of the slit 121. In other embodiments, the sealing insulating layer 141 may be formed along the sidewall of the slit 121.

In an embodiment of the present disclosure, the conductive layer 133 is etched through a wet etching process with an etchant exploiting a difference in etch selectivity between the conductive layer 133 and the core pattern 125 provided in the conductive layer. Consequently, the conductive patterns may be inhibited or prevented from being abnormally etched.

Figure 4:
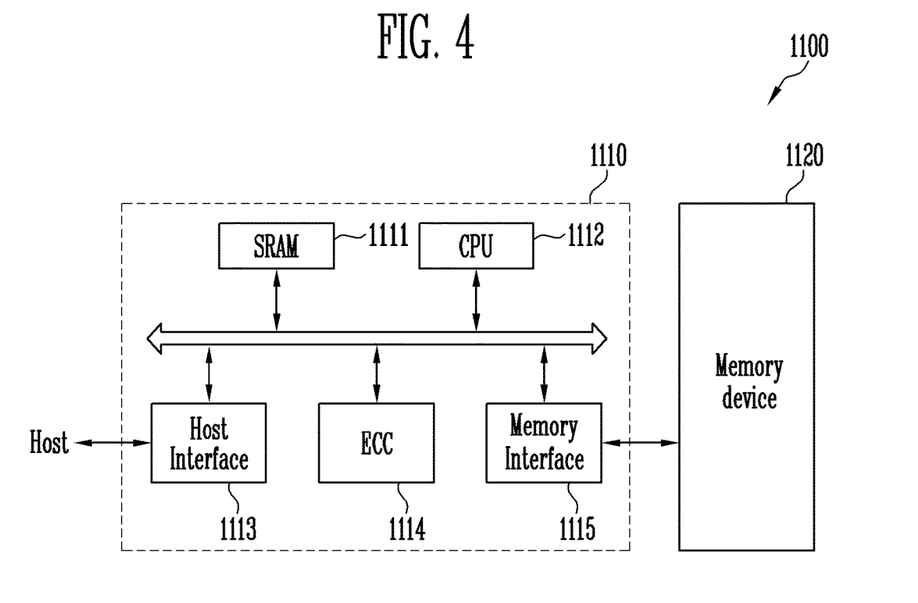
FIG. 4 shows a block diagram illustrating a memory system in accordance with an embodiment of the present disclosure.

FIG. 4 shows a block diagram illustrating a memory system 1100 in accordance with an embodiment of the present disclosure.

Referring to FIG. 4, the memory system 1100 includes a memory device 1120 and a memory controller 1110.

The memory device 1120 may include at least one of the structures described with reference to FIGS. 1A and 1B. The memory device 1120 may be formed through the processes described with reference to FIGS. 3A to 3E.

The memory device 1120 may be a multi-chip package formed of a plurality of memory chips. In an embodiment, an abnormal etch loss from the conductive patterns may be inhibited or prevented, mitigating the problem of defective patterns.

The memory controller 1110 may be configured to control the memory device 1120. The memory controller is shown to include a static random access memory (SRAM) 1111, a CPU 1112, a host interface 1113, an error correction code (ECC) circuit 1114, and a memory interface 1115. The SRAM 1111 is used as an operation memory for the CPU 1112. The CPU 1112 performs overall control operations for data exchanges involving the memory controller 1110. The host interface 1113 is provided with a data interchange protocol of a host coupled with the memory system 1100. Furthermore, the ECC circuit 1114 detects and corrects errors included in data that is read from the memory device 1120, and the memory interface 1115 interfaces with the memory device 1120. In addition, the memory controller 1110 may further include a read only memory (ROM) or the like that stores code data for interfacing with the host.

The above-described memory system 1100 may be implemented as memory card or a solid state disk (SSD) equipped with the memory device 1120 and the controller 1110. For example, when the memory system 1100 is an SSD, the memory controller 1110 may communicate with an external device (e.g., a host) via one of various interface protocols, such as, a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), or an integrated drive electronics (IDE).

Figure 5:
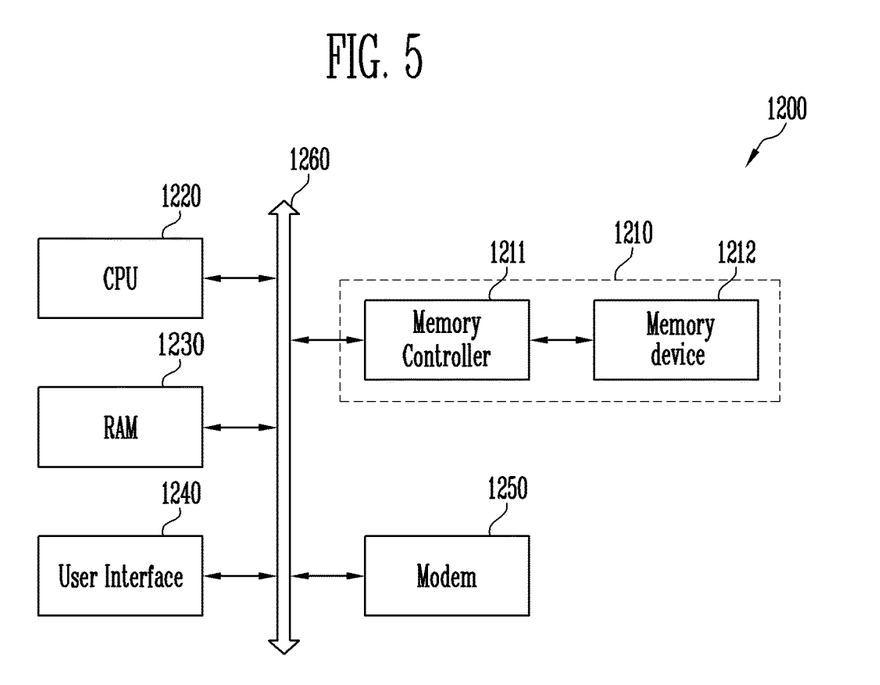
FIG. 5 shows a block diagram illustrating a computing system including the memory system illustrated by FIG. 4.

FIG. 5 shows a block diagram illustrating a computing system 1200, which for an embodiment includes the memory system 1100 illustrated with reference to FIG. 4.

Referring to FIG. 5, the computing system 1200 may include a central processing unit (CPU) 1220, a random access memory (RAM) 1230, a user interface 1240, a modem 1250, and a memory system 1210 that are operationally coupled via a system bus 1260. If the computing system 1200 is a mobile device, it may further include a battery for supplying an operating voltage to the computing system 1200. For other embodiments, an application chip set, a camera image processor (CIS), a mobile DRAM, and the like may be further included.

As described above with reference to FIG. 4, the memory system 1210 may be configured with the memory device 1212 and the memory controller 1211. For a particular embodiment, the memory controller 1211 and the memory device 1212 represent the memory controller 1110 and the memory device 1120, respectively. In various embodiments, the memory system 110 and/or the computing system 1200 may include a greater number of components and/or different components from those illustrated by FIGS. 4 and 5.

According to the present disclosure, during a process of etching conductive patterns including seams, surfaces of the conductive patterns are oxidized through a wet etching process, and oxidized portions of the conductive patterns are removed. Consequently, abnormal etching of the conductive patterns may be mitigated or prevented.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
   alternately forming sacrificial layers and interlayer insulating layers on a semiconductor substrate, wherein the interlayer insulating layers are interleaved with the sacrificial layers;
   forming a slit to expose the sacrificial layers by etching through the sacrificial layers and the interlayer insulating layers;
   forming interlayer openings by removing the exposed sacrificial layers;
   depositing a conductive material in the interlayer openings, wherein a first portion of the conductive material is deposited in the slit;
   oxidizing a second portion of the conductive material in the interlayer openings and in the slit using a wet etching process; and
   forming conductive patterns by removing the oxidized second portion of the conductive material from the interlayer openings and the slit.

2. The method according to claim 1, wherein depositing the conductive material in the interlayer openings comprises forming a seam in the conductive material deposited in each of the interlayer openings.

3. The method according to claim 2 further comprising depositing a core pattern in each seam.

4. The method according to claim 3, wherein the core pattern is deposited in each seam while depositing the conductive material in the interlayer openings.

5. The method according to claim 3, wherein the core pattern comprises an oxide layer.

6. The method according to claim 3, wherein the core pattern comprises a silicon oxide layer.

7. The method according to claim 3, wherein the wet etching process has a greater etch rate for the conductive material than for a material of the core pattern.

8. The method according to claim 3, wherein the wet etching process oxidizes and dissolves the second portion of the conductive material from the interlayer openings and the slit, and wherein the wet etching process leaves the core pattern of each seam intact.

9. The method according to claim 8, wherein the wet etching process results in the core pattern of each seam protruding from within a conductive pattern of the conductive patterns, beyond an etched face of the conductive pattern, into the slit.

10. The method according to claim 1, wherein an etchant used for the wet etching process comprises phosphoric acid, an oxidizer, a corrosion inhibitor, and a solvent.

11. The method according to claim 1 further comprising forming a barrier layer on surfaces of the interlayer openings and the slit prior to depositing the conductive material.

12. A method of manufacturing a semiconductor device, the method comprising:
   forming an interlayer opening interposed between a pair of adjacent interlayer insulating layers stacked on a semiconductor substrate;
   forming a conductive layer between the pair of adjacent interlayer insulating layers by depositing a conductive material in the interlayer opening;
   oxidizing a portion of the conductive layer using a wet etching process; and
   removing the oxidized portion of the conductive layer.

13. The method according to claim 12, wherein forming the conductive layer comprises forming a core pattern in the conductive layer.

14. The method according to claim 13, wherein forming the core pattern comprises depositing an oxide layer in a seam formed in the conductive layer.

15. The method according to claim 14, wherein the deposited oxide layer is a silicon oxide layer.

16. The method according to claim 13, wherein the wet etching process removes the oxidized portion of the conductive layer and leaves the core pattern intact.

17. The method according to claim 16, wherein the wet etching process results in the core pattern protruding from within the conductive layer beyond an etched face of the conductive layer.

18. The method according to claim 12, wherein an etchant used for the wet etching process comprises phosphoric acid, an oxidizer, a corrosion inhibitor, and a solvent.

* * * * *